United States Patent [19]

Mayer et al.

[11] Patent Number: 4,540,277

[45] Date of Patent: Sep. 10, 1985

[54] DEVICE FOR THE PROJECTION PRINTING OF MASKS INTO A WORKPIECE

[75] Inventors: Herbert Mayer; Ernst Löbach, both of Eschen, Liechtenstein

[73] Assignee: Perkin-Elmer Censor Anstalt, Vaduz, Liechtenstein

[21] Appl. No.: 507,549

[22] Filed: Jun. 24, 1983

[30] Foreign Application Priority Data

Jul. 9, 1982 [DE] Fed. Rep. of Germany ....... 3225746
May 25, 1983 [DE] Fed. Rep. of Germany ....... 3318980

[51] Int. Cl.³ .............................................. G03B 27/42
[52] U.S. Cl. ........................................ 355/53; 355/54; 356/401
[58] Field of Search .............. 355/53, 54, 43, 77, 355/46; 356/400, 401

[56] References Cited

U.S. PATENT DOCUMENTS 4,357,100 11/1982 Mayer et al. ..................... 355/43 X
4,452,526  6/1984 Johannsmeier et al. ......... 355/54 X Primary Examiner—L. T. Hix
Assistant Examiner—Della J. Rutledge
Attorney, Agent, or Firm—Pahl, Lorusso & Loud

[57] ABSTRACT

In order to determine magnification and/or alignment in a device for the projection printing of a pattern on a mask onto a substrate an adjustment plate insertable below the projection lens is provided, said adjustment plate being provided with light-transmitting zones conjugated with recesses in the mask in respect of the projection lens in the exposure light, photometer means being arranged below said light-transmitting zones.

7 Claims, 7 Drawing Figures

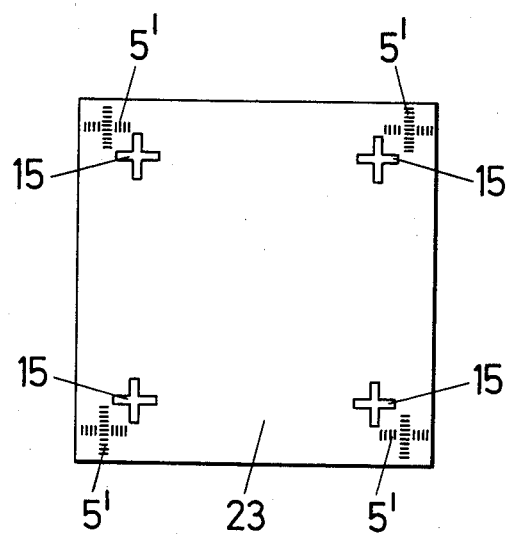

DEVICE FOR THE PROJECTION PRINTING OF MASKS INTO A WORKPIECE

BACKGROUND OF THE INVENTION

1. Field of the Invention

The invention relates to a device for the projection printing of masks onto a workpiece, particularly onto a semiconductor substrate for the production of integrated circuits, the patterns of the masks being imaged on a photosensitive layer of the workpiece via a projection lens by exposure light, and mask and workpiece being aligned relative to each other by imaging alignment patterns of the mask by means of adjustment light through the projection lens on adjustment marks of the workpiece and by using an inaccuracy of this imaging observed through the projection lens for the formation of an adjustment signal.

2. Description of the Prior Art

In the production of integrated circuits it is necessary that a number of masks having different circuit patterns are sequentially imaged on exactly the same area of the workpiece. After exposure and development the photosensitive layer serves for covering certain regions of the workpiece during chemical and physical processes, e. g. etching- and diffusing processes, carried out between the consecutive exposures. In the manufacture of integrated circuits high demands are made to accuracy.

Tolerable displacements of the consecutive images of the circuit patterns are, for example, less than 1 $\mu$m. In order to obtain such accuracy the circuit patterns on the masks are imaged on the workpiece, usually by means of a projection lens, reducing by the factor 10. Before exposing a workpiece or a portion of said workpiece which have already been provided with circuit elements it is necessary to align alignment patterns of the mask relative to adjustment marks on the workpiece by adjusting the mask or the workpiece, in order to obtain the desired overlay of the circuit patterns.

For the alignment process the respective adjustment mark areas on the workpiece and the areas of the alignment patterns on the mask are imaged into one another by means of the projection lens, the relative deviation being visually or metrologically determined. Positioning commands for the adjustment mechanism are deduced from the deviation.

In order to preserve the adjustment marks for future exposure processes, adjustment is frequently made with light having a wavelength to which the photosensitive resist is not sensitive. It may further be provided (cf. DE-OS 28 45 603) to arrange the alignment patterns of the mask, which may be in the shape of rectangular windows, and the adjustment marks on the workpiece, onto which the image of the alignment patterns shall be centered, at points non-conjugated in respect of the projection lens. In this case, auxiliary optical means are provided in the path of the adjustment light during adjustment.

Gauging is a problem in any kind of adjustment system: it must be ensured that the adjustment means judge the relative position of mask, projection lens and workpiece as optimal in which the overlay of successively applied circuit patterns in the exposure light is actually as accurate as possible. A systematic difficulty thereby results from the advantageously used adjustment light which is non-aggressive in respect of the photosensitive resist, as the projection lens is, of course, adjusted in respect of the exposure wavelength and not of the adjustment wavelength. The arrangement of auxiliary optical means, when using non-conjugated marks, also reduces the degree in which the evaluation result of the adjustment means can be considered representative for the actual quality of the picture overlay.

Gauging of the adjustment means is presently effected by successively moving the displacement stage carrying the workpiece into various positions and exposing said workpiece, the corresponding adjustment signal being noted. The exposed chips are developed and examined in respect of their quality. The adjustment signals which correspond to that position in which the best result has been obtained are used as set values for further exposures. It is obvious that such a complicated method for the adjustment of the adjustment means is justified for the first use of the device. It cannot be expected that the person using the device compensates the zero shift occuring in the course of time by means of this method. Moreover, the adjustment marks on the workpiece are not always at the same points so that a new adjustment of the adjustment means, which should be possible in an easy manner, is required, when switching between types of semiconductor substrates having different mark arrangements.

In order to obtain congruent imaging of a circuit pattern on a pattern which has already been imaged it is not sufficient to center the new pattern with the old one by displacing the mask or the workpiece in their own (X-Y) plane. It is further necessary to bring the workpiece into a position in which its entire surface to be exposed is precisely focused, which is effected by displacing the workpiece in Z-direction by means of three adjustment means not lying on a straight line. Congruent imaging of the patterns is, thus, not yet ensured, however, as finally a constant magnification scale for all imaging processes must be guaranteed, i.e. two points of the mask plane positioned at a certain distance from each other must always be imaged at the same reduced distance in the plane of the workpiece. As the projection lenses which are now in use are telecentric systems, magnification actually depends only on the distance of the mask from the projection lens but this distance can easily change when a new mask is inserted or through temperature influences so that the maintenance of the magnification scale forms an essential part of the adjustment process.

SUMMARY OF THE INVENTION

It is the object of the invention to permit control of at least one parameter required for the adjustment under exposure conditions without necessitating exposure of several workpieces and examination of the quality of the product.

According to the invention this is achieved by providing an adjustment plate which is insertable below the projection lens instead of the workpiece and is provided with light-transmitting zones conjugated with apertures in the mask in respect of the projection lens in the exposure light, photometer means being arranged below the light-transmitting zones.

If only the constancy of the magnification scale is controlled it is not necessary to establish a relation between the light-transmitting zones on the adjustment plate and the adjustment marks on the workpieces because the information obtained from the exposure of the adjustment plate can directly be used for adjusting the magnification, which does not depend on the distance of the workpiece from the projection lens.

If an additional checking of the adjustment means in respect of the actually obtained accuracy of the focusing in the exposure light is desired it is sufficient to observe marks on the upper side of the adjustment plate through the projection lens in the adjustment light, while the exposure light transmitted through the adjustment plate provides information on the focusing obtained under operating conditions. It will be understood, that the upper side of the light-transmitting zones forms a mark on the adjustment plate which is visible from above and eliminates the need for additional marks on said plate.

Normally the adjustment marks on the upper side of the adjustment plate are selected such that their shapes and distances correspond to the marks of the upper side of a workpiece. The adjustment signal received at that position in which a maximum of exposure light passes through the adjustment plate then designates the set position.

There are basically two possibilities of gauging the adjustment means: it can be ascertained to which extent the adjustment plate must be displaced from its ideal position to obtain that signal in the adjustment means which indicates optimal adjustment. When adjusting a workpiece, its position in respect of that position which gives the optimal adjustment signal is to be corrected by the extent of said displacement. It is possible, on the other hand, to adjust the adjustment means such that the signals received by the means have a maximum or minimum value in the optimal position of the adjustment plate ascertained in the exposure light, the workpiece being displaced until reaching said value.

The device according to the invention may be used in such a manner that signals are successively produced under exposure and adjustment conditions in the photometer means below the adjustment plate as well as in the adjustment means. Then measurements can, however, also be made simultaneously if it has been ascertained that the other type of light does not cause disturbances.

BRIEF DESCRIPTION OF THE DRAWING

Further details of the invention will be described in the following by means of the figures of the drawing, in which FIG. 7 shows an adjustment plate for the control of the magnification scale.

DESCRIPTION OF THE PREFERRED EMBODIMENT

Figure 1:
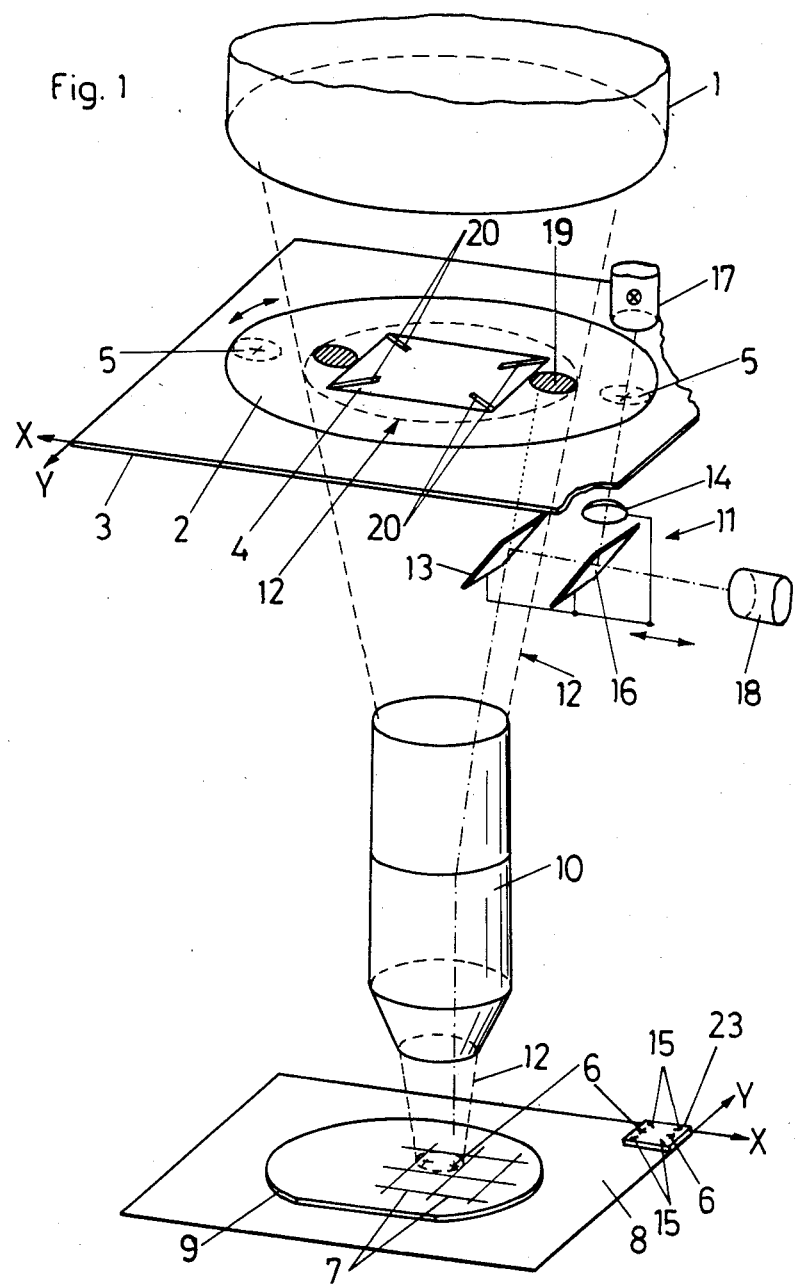
FIG. 1 shows a schematic oblique view of a device for the projection printing of masks onto a semiconductor substrate.

FIG. 1 shows the essential features of a device for partially exposing a semiconductor substrate. The substrate 9 rests on a displacement stage 8 movable step by step in the direction of the XY-coordinates and vertically through means illustrated in FIGS. 2 and 3. A mask stage 3 is disposed above the displacement stage 8, said mask stage receiving the mask 2 and also being continuously movable in the direction of the X- and Y-coordinates and, if required, also being pivotable. A projection lens 10, which images the pattern 4 of the mask 2 onto the workpiece 9 at the scale of 10:1, is disposed between the displacement stage 8 and the mask stage 3. Exposure means 1 are provided above the mask stage 3. As at least after each second exposure of the same area of the workpiece an exact alignment of this area relative to circuit elements and circuit patterns already provided on the workpiece has to be made, alignment patterns 5 are disposed on the mask 2 and adjustment marks 6 on the workpiece 9. The adjustment marks 6 can be produced on the workpiece in the course of the first exposure, e.g. by means of a laser. In the embodiment shown the alignment patterns of the mask 2 and the adjustment marks of the workpiece 9 are positioned in non-conjugated areas in respect of the projection lens 10. In order to be able to image the areas of the adjustment marks and the alignment patterns into one another during the alignment process auxiliary optical means 11 comprising two inverting mirrors 13 and a correction lens 14 are provided. Said auxiliary means effect a parallel displacement of the light beams reflected by the adjustment mark. A light source 17 is provided for illuminating the alignment patterns 5 and the adjustment marks 6 during the alignment process, the light of said light source effecting no change of the photosensitive layer disposed on the workpiece 9.

The light produced by the light source 17 projects an image of the alignment pattern on the workpiece 9 by means of a correction lens 14, the mirrors 13 and 16 and the projection lens 10, said image together with the adjustment mark 6 being conveyed to photoelectric means 18 by back projection by means of the mirrors 13 and 16, said photoelectric means deducing signals from the relative displacement of the marks, which can be used for controlling the positioning units (not illustrated) for aligning the mask and/or workpiece. The mirror 16 is adapted to be semi-transmitting. For purposes of simplicity the illuminating and photoelectric means as well as the auxiliary optical means are illustrated for one pair of marks 5 and 6 only.

After the alignment process the auxiliary optical means 11 are removed, and the workpiece 9 is exposed. Thereby the pattern 4 is transferred to one of the chips 7. This pattern normally corresponds to an electric circuit. (In the drawing, however, the mask required for gauging the adjustment means is illustrated, said mask being provided with line-shaped apertures 20.) After exposure the displacement stage 8 is moved to the next chip, the required adjustment process is carried out again by means of the auxiliary optical means 11, and exposure is subsequently effected again.

Figure 2:
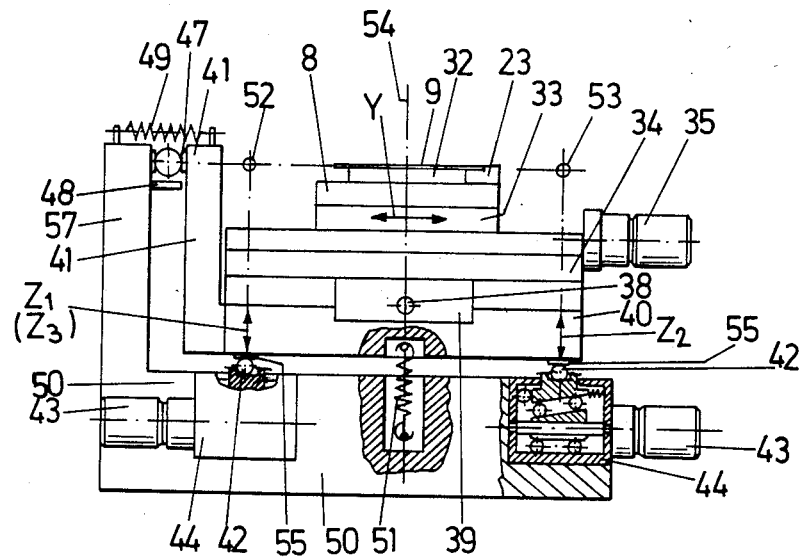
FIGS. 2 and 3 show a side view, parts thereof in section, and a top view of the displacement means for the semiconductor substrate and the adjustment plate.
Figure 3:
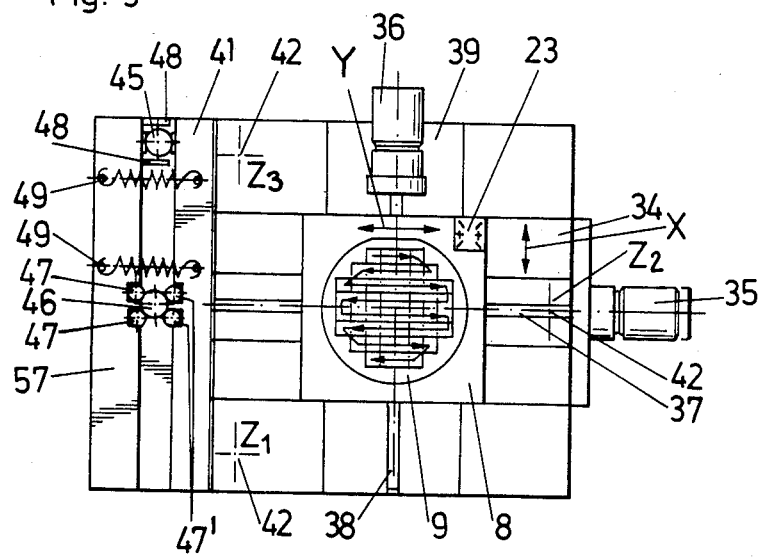

As illustrated in FIGS. 2 and 3, the workpiece 9, which is a wafer, is disposed on a vacuum chuck 32 displaceable in the X- and Y-direction by means of carriages 34 and 33. Displacement in the Y-direction is effected by a motor 35 through a spindle 37, displacement in the X-direction is effected by a motor 36 through a spindle 38. The carriage 34 is moved in a guide 39 of the base plate 40.

Three posts 44 are provided for the vertical adjustment of the base plate 40, each of them having a motor 43 acting on a wedge drive. At the upper side of each post 44 there is a ball 42 which is freely movable in horizontal direction to an extent sufficient for the level adjustments to be carried out.

A uniform movement of the three posts 44 results in a vertical parallel displacement of the base plate 40 against the action of the spring 51. When, however, the three posts 44 are differentially moved, the position of the base plate 40 and, hence, of the wafer 9 relative to the horizontal plane is changed. Guide means arranged at the level of the wafer 9 and comprising a ball 46 and four cylinders 47, 47' serve to ensure that during such change of position, independently of the actual position of the carriages 33 and 34, unintentional horizontal shifting of that region of the wafer through which the optical axis runs is avoided. Because the ball 46 is movable only in vertical direction in respect of the upward flange 57 of the stage supporting the posts 44, also the cylinders 47' on the opposite upward member of the base plate, which may be a bow member 41, are vertically movable only. Swinging movement of the cylinder 47' can be effected only about one axis lying in the wafer plane.

The members of the device according to FIG. 2 and FIG. 3 described so far do not yet exclude a horizontal swing of the base plate 40 about the ball 46. In order to fully determine the system, there is provided a ball 45 movable along guide surfaces on the bow member 41 and on the upward flange 57 of the supporting stage 50, the springs 49, on the one hand, and the stops 48, on the other hand, preventing the ball 45 from falling out.

Figure 4:
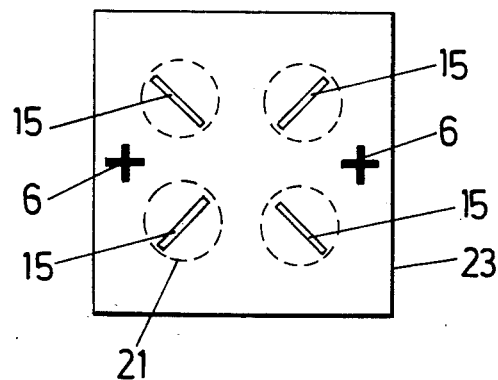
FIGS. 4 and 5 show a top view and a side view of the adjustment plate according to the invention.
Figure 5:
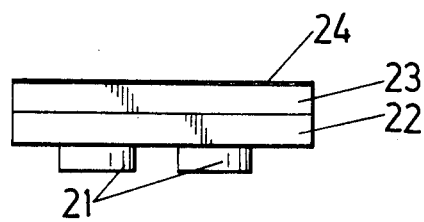

The essential feature of the illustrated device, whose above-described details are to be considered as examples only which may be varied almost to any desired extent, is the adjustment plate 23 illustrated in detail in FIG. 4 and 5. Said adjustment plate is a glass plate having an edge length of 10 mm, for example, and a thickness in the range of 1 mm. A chromium layer having a thickness of 0,5 $\mu$m is disposed on said glass plate, light-transmitting zones 15 being etched into said chromium layer onto which the apertures 20 of the mask 2 are to be imaged through the projection lens 10. Photometer means 21 in the form of usual photodiodes emit a signal corresponding to the intensity of the light which moves from the exposure means 1 through the apertures 20 of the mask 2 via the projection lens 10 through the light-transmitting zones 15. The breadth of the light-transmitting zones 15 may be 1,5 $\mu$m, for example, their length 2 mm. The dimensions of the associated apertures 20 of the mask are naturally ten times greater, when the projection ratio is 10:1. The adjustment marks 6 at the upper side of the adjustment plate 23 are illustrated schematically only, as this part of the device is known in the art. The filter layer 22 transmits the exposure light only. Said layer is only required if the signals of the adjustment means and of the gauging means according to the invention corresponding to a set position are to be received simultaneously.

For the gauging and adjusting process the adjustment plate 23 is disposed below the projection lens 10 instead of a "real" exposure field. The device then carries out the following operations: exposure- and adjustment light are switched on simultaneously; the mask 2 is moved stepwise, e.g. in X-direction, such that the images of the apertures 20 are moved over the light-transmitting zones 15; prior to each step in X-direction the adjustment plate 23 and the displacement stage 8 are lifted by a step ($Z_1$, $Z_2$, $Z_3$ -steps simultaneously); the intensity values measured by the photodiodes are stored in the memory of the device for each X- and Z-step.

Figure 6:
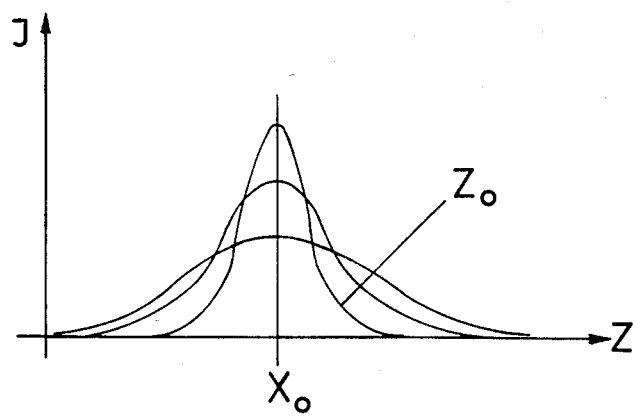
FIG. 6 shows the signals obtained by means of the adjustment plate.

For each photometer means (photodiode 21) a group of curves, as illustrated in FIG. 6, is obtained. The real image produced by the exposure light which is responsible for the change of the wafer, when the device is in use, is then at the correct point $X_o$ in X-direction, where intensity reaches a relative maximum during displacement in this direction. Optimum focusing ($Z_o$) is obtained, where said maximum reaches the highest value compared to the one of the adjacent curves.

When the optimum position of the real image has thus been determined in all dimensions (X,Y,$\theta$,$Z_1$,$Z_2$,$Z_3$), the adjustment plate 23 can be moved into this position. The associated adjustment signals are then the set values for the process. It may be of advantage to adjust the adjustment means in such a manner that the signals received therefrom have an extreme value, when the adjustment plate 23 is in its determined optimum position.

As shown in FIG. 7, the mask may be centered and also focused in respect of the workpiece and in respect of the adjustment plate 23 even if there is still a lack of sufficiently precise overlay of the images of different masks on the workpiece and on the adjustment plate. The reason is that the magnification scale changes through changes of the distance between mask and projection lens and that it may occur that the distance between two points projected from the mask 2 onto the workpiece is too small or—as illustrated in FIG. 7—too big. Such a magnification error can be detected by means of the adjustment plate 23 according to the invention because the images 5' of the alignment pattern 5 and all light-transmitting zones 15 overlie one another at the same time only if the magnification in two directions normal to each other has the prescribed value.

To find out if the projection lens magnifies to a different extent in two directions which are normal to each other, i.e. has an anamorphotic imaging error, three light-transmitting zones 15 would actually be sufficient. The quadrangular arrangement of the light-transmitting zones facilitates, however, the distinction between the anamorphotic error of the lens and a trapezoid error caused by tilting of the mask, i.e. imaging a rectangle on the mask as a trapezoid.

The device according to the invention cannot only be used to determine once and for all the value of a parameter required for the adjustment under exposure conditions. Deficiencies of the overlay accuracy of patterns projected onto each other on a workpiece are frequently caused by the fact that the adjusted value changes subsequently, such changes being of particular disadvantage when occuring during the exposure time. Simulation of the exposure process, where the photoresist-coated workpiece is replaced by the adjustment plate according to the invention permits determination of the extent to which the controlled parameter changes during the exposure process. The kind of change can be determined by successively measuring the change of the controlled parameter after a pre-set period in respect of its initial value. The deviation of the average value of the parameter from the initial value, determined after the pre-set time is then a measure for systematic changes as, for example, changes caused by temperature rises. To what extent the displacements have been caused by accidental influences or vibrations can be seen from the standard deviation of the controlled parameter in respect of the average value of its change.

What is claimed is:

1. A device for the projection printing of masks onto a workpiece, particularly onto a semiconductor substrate for the production of integrated circuits, the patterns of the masks being imaged on a photosensitive layer of the workpiece via a projection lens by exposure light, and mask and workpiece being aligned relative to each other by imaging alignment patterns of the mask by means of adjustment light through the projection lens for the formation of an adjustment signal, said device comprising an adjustment plate insertable below the projection lens instead of the workpiece, said adjustment plate having light-transmitting zones conjugated with recesses in said mask in respect of said projection lens in exposure light, photometer means arranged below said light-transmitting zones.

2. A device as claimed in claim 1, wherein adjustment marks are provided on the upper side of said adjustment plate.

3. A device as claimed in claim 2, wherein said adjustment marks on the upper side of said adjustment plate correspond to the adjustment marks on the workpiece to be exposed.

4. A device as claimed in claim 1, wherein filters are disposed in front of said photometer means, said filters being non-transmitting with respect to the adjustment light, if the adjustment wavelength deviates from the exposure wavelength.

5. A device as claimed in claim 1, wherein said adjustment plate is made of glass and provided with a cover layer of chromium into which light-transmitting zones are etched.

6. A device as claimed in claim 1, wherein said adjustment plate is rigidly arranged on the displacement stage for said workpiece.

7. A method for adjusting a device used for the projection printing of masks onto a workpiece, the patterns of the masks being imaged on a photosensitive layer of the workpiece via a projection lens by exposure light, the mask and workpiece being aligned relative to each other by imaging alignment patterns of the mask by means of adjustment light through the projection lens on adjustment marks of the workpiece and by using an inaccuracy of this imaging observed through the projection lens for the formation of an adjustment signal, said method comprising the steps of:

inserting an adjustment plate below the projection lens instead of the workpiece, said adjustment plate having light-transmitting zones conjugated with recesses in said mask, changing the relative position of said mask and said adjustment plate with respect to at least one coordinate, registering signals associated with identical positions, said signals corresponding, on the one hand, to intensity of the exposure light transmitted by said adjustment plate and, on the other hand, to the accuracy observed through said projection lens of the imaging of said alignment patterns of said mask onto said adjustment marks of said adjustment plate in the adjustment light, adjusting the set values of the position of said workpiece through use of the obtained relation of adjustment light signals and expsoure light signals.

* * * * *